(12) United States Patent
Jeon et al.

(10) Patent No.: US 10,656,520 B2
(45) Date of Patent: May 19, 2020

(54) PHOTOSENSITIVE RESIN COMPOSITION AND CURED FILM PREPARED THEREFROM

(71) Applicant: Rohm and Haas Electronic Materials Korea Ltd., Cheonan (KR)

(72) Inventors: Hyung-Tak Jeon, Hwaseong (KR); Seok-Bong Park, Yongin (KR); Gyung-Sik Choi, Hwaseong (KR)

(73) Assignee: Rohm and Haas Electronic Materials Korea Ltd, Seoul (KR)

( * ) Notice: Subject to any disclaimer, the term of this patent is extended or adjusted under 35 U.S.C. 154(b) by 0 days.

(21) Appl. No.: 15/775,441

(22) PCT Filed: Sep. 30, 2016

(86) PCT No.: PCT/KR2016/010961
§ 371 (c)(1),
(2) Date: May 11, 2018

(87) PCT Pub. No.: WO2017/090879
PCT Pub. Date: Jun. 1, 2017

(65) Prior Publication Data
US 2018/0373144 A1    Dec. 27, 2018

(30) Foreign Application Priority Data

Nov. 25, 2015  (KR) .................. 10-2015-0165692
Sep. 29, 2016  (KR) .................. 10-2016-0125432

(51) Int. Cl.
G03F 7/027  (2006.01)
G03F 7/033  (2006.01)
(Continued)

(52) U.S. Cl.
CPC ........ *G03F 7/027* (2013.01); *C08F 222/1006* (2013.01); *C08F 265/06* (2013.01);
(Continued)

(58) Field of Classification Search
CPC ... G03F 7/027; C09D 151/003; C09D 133/06; C08F 265/10; C08F 222/1006; C08F 265/06; C08F 212/08; C08F 220/06; C08F 222/40; C08F 2220/325; C08L 63/00; C08L 33/04; G02F 1/13762; G02F 1/13394
See application file for complete search history.

(56) References Cited

U.S. PATENT DOCUMENTS

| | | | |
|---|---|---|---|
| 6,680,763 B2 | 1/2004 | Sumino et al. | |
| 2010/0143673 A1 | 6/2010 | Mitsukura et al. | |
| 2015/0205203 A1 | 7/2015 | Fujiwara et al. | |

FOREIGN PATENT DOCUMENTS

| | | |
|---|---|---|
| JP | 2002-212235 A | 7/2002 |
| JP | 2003-029402 A | 1/2003 |
| KR | 2010-0109498 A | 10/2010 |

*Primary Examiner* — Jessica M Roswell
(74) *Attorney, Agent, or Firm* — Gordon C. Campbell

(57) ABSTRACT

Disclosed herein are a photosensitive resin composition and a cured film prepared therefrom. By comprising a copolymer (A) and a photopolymerizable compound (B) in specific amounts, a photosensitive resin composition may form a cured film having pattern developability with high resolution and good elasticity recovery rate. The composition may be effectively used for the formation of a cured film, particularly a spacer of a display device such as a liquid crystal display and an organic electroluminescence device.

6 Claims, 1 Drawing Sheet

(51) Int. Cl.
*H01B 3/44* (2006.01)
*G02F 1/137* (2006.01)
*C08L 63/00* (2006.01)
*C08L 33/04* (2006.01)
*C08F 265/06* (2006.01)
*C08F 222/10* (2006.01)
*C09D 151/00* (2006.01)
*C08F 265/10* (2006.01)
*C09D 133/06* (2006.01)
C08F 220/32 (2006.01)
C08F 222/40 (2006.01)
C08F 220/06 (2006.01)
C08F 212/08 (2006.01)
G02F 1/1339 (2006.01)

(52) U.S. Cl.
CPC ............ *C08F 265/10* (2013.01); *C08L 33/04* (2013.01); *C08L 63/00* (2013.01); *C09D 133/06* (2013.01); *C09D 151/003* (2013.01); *G02F 1/13762* (2013.01); *G03F 7/033* (2013.01); *C08F 212/08* (2013.01); *C08F 220/06* (2013.01); *C08F 222/40* (2013.01); *C08F 2220/325* (2013.01); *C08L 2312/06* (2013.01); *G02F 1/13394* (2013.01)

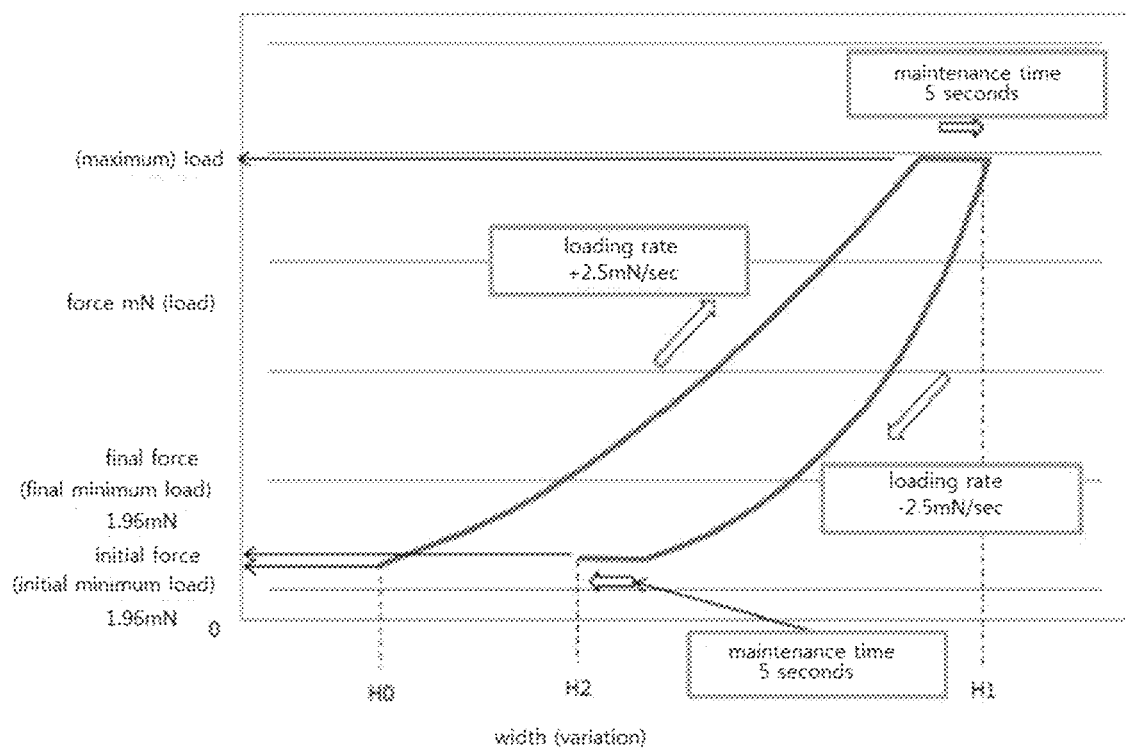

PHOTOSENSITIVE RESIN COMPOSITION AND CURED FILM PREPARED THEREFROM

TECHNICAL FIELD

The present invention relates to a photosensitive resin composition and a cured film prepared therefrom, in particular a photosensitive resin composition, from which a cured film that has developability of a pattern with high resolution and good elasticity recovery rate may be formed, and which may be used for the formation of a cured film, particularly a spacer in a display such as a liquid crystal display and an organic electroluminescent (EL) display; and a cured film, particularly a spacer prepared therefrom.

BACKGROUND ART

A photosensitive resin composition is widely used for a cured film of various displays such as a liquid crystal display and an organic EL display. Particularly, in a liquid crystal cell of a liquid crystal display, a spacer formed using a photosensitive resin composition may be employed to maintain a gap between upper and lower transparent substrates constant, and the spacer is generally formed by a method including coating a photosensitive resin composition on a substrate, followed by exposure to ultraviolet ray, etc. via a mask, and developing.

In the case where the spacer is applied to a small display having small pixels such as a cellular phone and a tablet PC, the formation of a spacer pattern with high resolution is crucial. Further, elasticity recovery rate that may sufficiently endure external impact onto a touch screen is also crucial.

Elasticity recovery rate is influenced by the number of crosslinking bonds in a composition that are formed through light exposure and thermal curing during performing processes. If the amount of photopolymerizable compound increases in a photosensitive resin composition, the number of crosslinking bonds may be largely increased through light exposure, thereby improving the elasticity recovery rate. However, the mere increase of the amount of the photopolymerizable compound may decrease the number of functional groups that assist the development of a polymer, or increase sensitivity to exposure intensity, thereby increasing the size of a dot pattern and negatively affecting the formation of a pattern with high resolution.

Accordingly, a photosensitive resin composition that may resolve the above-described defects in a development process, improve elasticity recovery rate, and produce a pattern with high resolution is required.

In this regard, Korean Laid-open Patent Publization No. 10-2001-0059259 discloses a photosensitive resin composition comprising a polymer, a polyfunctional acrylate monomer, and a photopolymerization initiator; and a color filter for a liquid crystal display. However, it does not disclose a photosensitive resin composition comprising a photopolymerizable compound containing hepta- or more functional groups.

In addition, Korean Laid-open Patent Publization No. 10-2010-0028486 discloses a photosensitive resin composition comprising (A) a resin having an acid functional group in a side chain, (B1) a hexafunctional polymerizable compound, and (B2) a heptafunctional polymerizable compound, and enduring vibration with high frequency. However, high resolution and good elasticity recovery rate are not disclosed therein.

Therefore, a photosensitive resin composition that may provide high resolution and good elasticity recovery rate, which are required in a cured film, particularly in a spacer of various displays such as a liquid crystal display and an organic EL device, is required.

DISCLOSURE OF INVENTION

Technical Problem

Accordingly, an object of the present invention is to provide a photosensitive resin composition which may form a cured film that has developability of a pattern with high resolution and good elasticity recovery rate, and may be effectively used for the formation of a cured film, particularly a spacer of a display such as a liquid crystal display and an organic EL display; and also a cured film prepared therefrom.

Solution to Problem

According to one aspect of the present invention, there is provided a photosensitive resin composition, comprising:
(A) a copolymer; (B) a photopolymerizable compound comprising a first photopolymerizable compound (B1) containing hexa- or less functional groups and a second photopolymerizable compound (B2) containing hepta- or more functional groups;
and (C) a photopolymerization initiator, wherein a weight ratio of the copolymer (A) and the first and second photopolymerizable compounds (B1 and B2) satisfies the following Equation 1, and a weight ratio of the first photopolymerizable compound (B1) and the second photopolymerizable compound (B2) satisfies the following Equation 2.

$$2.1 \leq (B1+B2)/(A) \leq 2.5 \quad \text{[Equation 1]}$$

$$0.2 \leq B2/B1 \leq 0.5 \quad \text{[Equation 2]}$$

According to another aspect of the present invention, there is provided a cured film prepared from the photosensitive resin composition.

Advantageous Effects of Invention

The photosensitive resin composition of the present invention may form a cured film having developability of a pattern with high resolution and good elasticity recovery rate by including a copolymer (A) and a photopolymerizable compound (B) in specific amounts, and may be effectively used for the formation of a cured film, particularly a spacer of a display such as a liquid crystal display and an organic EL display.

BRIEF DESCRIPTION OF DRAWINGS

FIG. 1 is a graph obtained by measuring elasticity recovery rate in accordance with the load of a cured film.

BEST MODE FOR CARRYING OUT THE INVENTION

The photosensitive resin composition according to the present invention comprises (A) a copolymer; (B) a photopolymerizable compound comprising a first polymerizable compound containing hexa- or less functional groups (B1) and a second photopolymerizable compound containing hepta- or more functional groups (B2); and (C) a photopolymerization initiator, and may additionally comprise (D) a solvent; (E) an epoxy compound, and an additive such as (F) a surfactant and (G) a silane coupling agent (adhesion assisting agent).

Hereinafter, the components of the composition of the present invention will be explained in detail.

In the present description, "(meth)acryl" means "acryl" and/or "methacryl", and "(meth)acrylate" means "acrylate" and/or "methacrylate".

(A) Copolymer

The photosensitive resin composition of the present invention may include a copolymer, which may be a random copolymer.

The copolymer may include (A1) a structural unit derived from an ethylenically unsaturated carboxylic acid, an ethylenically unsaturated carboxylic anhydride, or a mixture thereof, and (A2) a structural unit derived from an ethylenically unsaturated compound containing an aromatic ring, and may selectively include (A3) a structural unit derived from an ethylenically unsaturated compound different from the structural units (A1) and (A2). The copolymer may correspond to an alkali-soluble resin for achieving desired developability during the development step and may function as a basic support for forming a film after coating and a structure for final patterns and a binder.

(A1) Structural Unit Derived from an Ethylenically Unsaturated Carboxylic Acid, an Ethylenically Unsaturated Carboxylic Anhydride, or a Mixture Thereof In the present invention, the structural unit (A1) is derived from an ethylenically unsaturated carboxylic acid, an ethylenically unsaturated carboxylic anhydride, or a mixture thereof. The ethylenically unsaturated carboxylic acid, the ethylenically unsaturated carboxylic anhydride, or the mixture thereof is a polymerizable unsaturated monomer having at least one carboxyl group in a molecule. Examples thereof include an unsaturated monocarboxylic acid such as (meth) acrylic acid, crotonic acid, alpha-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, and mono[2-(meth)acryloyloxyethyl] phthalate, but are not limited thereto. In terms of developability, (meth)acrylic acid is preferred among them.

The amount of the structural unit (A1) derived from an ethylenically unsaturated carboxylic acid, an ethylenically unsaturated carboxylic anhydride, or a mixture thereof may be 5 to 65 mole %, preferably 10 to 50 mole % based on the total number of moles of the structural units constituting the random copolymer to maintain good developability.

(A2) Structural Unit Derived from an Ethylenically Unsaturated Compound Containing an Aromatic Ring In the present invention, the structural unit (A2) is derived from an ethylenically unsaturated compound containing an aromatic ring, and examples of the ethylenically unsaturated compound containing an aromatic ring may be at least one selected from the group consisting of phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth) acrylate; styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene having halogen such as fluorostyrene, chlorostyrene, bromostyrene, and iodostyrene; styrene having an alkoxy substituent such as methoxystyrene, ethoxystyrene, and propoxystyrene; 4-hydroxy styrene, p-hydroxy-α-methylstyrene, acetylstyrene; vinyltoluene, divinylbenzene, vinylphenol, o-vinylbenzyl methyl ether, m-vinylbenzyl methyl ether, p-vinylbenzyl methyl ether, o-vinylbenzyl glycidyl ether, m-vinylbenzyl glycidyl ether, and p-vinylbenzyl glycidyl ether, and preferably, may be styrene compounds in consideration of polymerization properties.

The amount of the structural unit (A2) derived from an ethylenically unsaturated compound containing an aromatic ring may be 2 to 70 mole %, preferably 5 to 60 mole % in consideration of chemical resistance, based on the total number of moles of the structural units constituting the random copolymer.

The copolymer of the present invention may additionally include a structural unit (A3) derived from an ethylenically unsaturated compound different from the structural units (A1) and (A2).

(A3) Structural Unit Derived from an Ethylenically Unsaturated Compound Different from the Structural Units (A1) and (A2)

In the present invention, the structural unit (A3) is derived from an ethylenically unsaturated compound different from the structural units (A1) and (A2), and the ethylenically unsaturated compound different from the structural units (A1) and (A2) may be at least one selected from the group consisting of an unsaturated carboxylic acid ester such as methyl (meth)acrylate, ethyl (meth)acrylate, butyl (meth) acrylate, dimethylaminoethyl (meth)acrylate, isobutyl (meth)acrylate, t-butyl (meth)acrylate, cyclohexyl (meth) acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth) acrylate, 3-methoxybutyl (meth)acrylate, ethoxy diethylene glycol (meth)acrylate, methoxy triethylene glycol (meth) acrylate, methoxy tripropylene glycol (meth)acrylate, poly (ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such N-vinyl pyrrolidone, N-vinyl carbazole and N-vinyl morpholine; an unsaturated ether such as vinyl methyl ether and vinyl ethyl ether; an ethylenically unsaturated compound containing an epoxy group such as glycidyl (meth)acrylate, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth) acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-2,3-epoxypropoxy)-3,5-dimethylphenylpropyl)acrylamide, 4-hydroxybutyl (meth)acrylate glycidyl ether, allyl glycidyl ether, and 2-methylallyl glycidyl ether; and an unsaturated imide such as N-phenylmaleimide, N-(4-chlorophenyl)maleimide, N-(4-hydroxyphenyl)maleimide, and N-cyclohexylmaleimide.

Preferably, the structural unit derived from the ethylenically unsaturated compound containing an epoxy group and/or the unsaturated imide may be used, and the structural unit derived from glycidyl (meth)acrylate, 4-hydroxybutyl (meth)acrylate glycidyl ether and/or N-substituted maleimide may preferably be used in consideration of copolymerization property and the strength of an insulating film.

The amount of the structural unit (A3) derived from an ethylenically unsaturated compound different from the structural units (A1) and (A2) may be 10 to 80 mole %, preferably 20 to 75 mole %, based on the total number of moles of the structural units constituting the copolymer. Within this amount range, the stability of a composition may be maintained when constituting a binder and the retention rate may be improved further.

The copolymer (A) may include a (meth)acrylic acid/styrene copolymer, a (meth)acrylic acid/benzyl (meth)acrylate copolymer, a (meth)acrylic acid/styrene/methyl (meth) acrylate copolymer, a (meth)acrylic acid/styrene/methyl (meth)acrylate/glycidyl (meth)acrylate copolymer, a (meth) acrylic acid/styrene/methyl (meth)acrylate/glycidyl (meth) acrylate/N-phenylmaleimide copolymer, a (meth)acrylic acid/styrene/methyl (meth)acrylate/glycidyl (meth)acrylate/N-cyclohexyl maleimide copolymer, a (meth)acrylic acid/styrene/n-butyl (meth)acrylate/glycidyl (meth)acrylate/N-phenyl maleimide copolymer, a (meth)acrylic acid/styrene/glycidyl (meth)acrylate/N-phenylmaleimide copolymer, a (meth)acrylic acid/styrene/4-hydroxybutyl (meth)acrylate glycidyl ether/N-phenylmaleimide copolymer, and the like. One or more copolymers may be included in the photosensitive resin composition.

The copolymer may be prepared by charging a molecular weight regulator, a radical polymerization initiator, a solvent, and respective compounds that provide the structural units (A1), (A2), and (A3), introducing nitrogen, and subjecting the mixture to polymerization with slow agitation. The copolymer may be prepared as a random copolymer.

The molecular weight regulator may be a mercaptan compound such as butyl mercaptan and octyl mercaptan, or an α-methylstyrene dimer, but is not limited thereto.

The radical polymerization initiator may be at least one selected from the group consisting of an azo compound such as 2,2'-azobisisobutyronitrile, 2,2'-azobis(2,4-dimethylvaleronitrile), and 2,2'-azobis(4-methoxy-2,4-dimethylvaleronitrile), benzoyl peroxide, lauryl peroxide, t-butyl peroxypivalate and 1,1-bis(t-butylperoxy)cyclohexane, but is not limited thereto.

Also, the solvent may be any conventional solvent commonly used in the manufacturing of a copolymer and may include, e.g., methyl 3-methoxypropionate or propylene glycol monomethyl ether acetate (PGMEA).

The copolymer (A) may be used in an amount of 25 to 35 wt %, preferably 28 to 32 wt %, based on the total weight of the photosensitive resin composition excluding solvents. Within this range, the composition would produce a patterned film having a good profile after development with improved properties such as retention rate and chemical resistance.

The weight average molecular weight (Mw) of the copolymer thus prepared may be in the range of 10,000 to 20,000, and preferably 15,000 to 18,000, when determined by gel permeation chromatography (GPC, using tetrahydrofuran as an eluent) referenced to polystyrene. Within this range, the composition would have desirable improvements in planarity and a good pattern profile after development.

(B) Photopolymerizable Compound

The photosensitive resin composition of the present invention may include a first photopolymerizable compound (B1) containing hexa- or less functional groups and a second photopolymerizable compound (B2) containing hepta- or more functional groups.

The photopolymerizable compound may be polymerized by the action of a photopolymerization initiator.

(B1) First Photopolymerizable Compound Containing Hexa- or Less Functional Groups The first photopolymerizable compound (B1) containing hexa- or less functional groups may include a monofunctional or polyfunctional ester compound of acrylic acid or methacrylic acid having at least one ethylenically unsaturated double bond; however it may preferably be a polyfunctional compound having two or more functional groups in consideration of chemical resistance.

The first photopolymerizable compound may be selected from the group consisting of ethylene glycol di(meth)acrylate, propylene glycol di(meth)acrylate, diethylene glycol di(meth)acrylate, triethylene glycol di(meth)acrylate, glycerin tri(meth)acrylate, trimethylolpropane tri(meth)acrylate, dipentaerythritol tetra(meth)acrylate, dipentaerythritol penta (meth)acrylate, dipentaerythritol hexa(meth)acrylate, dipentaerythritol tetraacrylate, dipentaerythritol pentaacrylate, and dipentaerythritol hexaacrylate. In order to increase the strength of a cured film, dipentaerythritol penta(meth)acrylate, and dipentaerythritol hexa(meth)acrylate may preferably be used.

The first photopolymerizable compound may be used alone or in combination of two or more thereof. The amount of the first photopolymerizable compound may be 50 to 250 parts by weight, preferably 100 to 200 parts by weight, based on 100 parts by weight of the copolymer (on the basis of the solid content). Within this range, good sensitivity and planarity may be achieved. However, if the amount deviates from the range, particularly if the amount is less than 50 parts by weight, elasticity recovery rate may be deteriorated, and if the amount is greater than 250 parts by weight, resolution may be deteriorated.

(B2) Second Photopolymerizable Compound Containing Hepta- or More Functional Groups The second photopolymerizable compound (B2) containing hepta- or more functional groups may be a polyfunctional ester compound of acrylic acid or methacrylic acid having at least one ethylenically unsaturated group, and the hepta- or more polyfunctional compound may be preferable in consideration of chemical resistance.

The second photopolymerizable compound may be at least one selected from the group consisting of tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca (meth)acrylate and pentapentaerythritol dodeca(meth) acrylate; and may preferably be tripentaerythritol hepta (meth)acrylate, or tripentaerythritol octa(meth)acrylate to improve resolution and strength.

The second photopolymerizable compound may be used alone or in combination of two or more thereof and may be used in an amount of 35 to 100 parts by weight, 50 to 100 parts by weight, and preferably 35 to 90 parts by weight, based on 100 parts by weight (on the basis of the solid content) of the copolymer. Within this range, good sensitivity and planarity may be achieved. However, if the amount deviates from the range, particularly if the amount is less than 35 parts by weight, resolution may be deteriorated, and if the amount is greater than 100 parts by weight, elasticity recovery rate may be deteriorated.

The weight ratio of the copolymer (A) and the first and second photopolymerizable compounds (B1 and B2) included in the photosensitive resin composition of the present invention satisfies the following Equation 1, and preferably, the value of Equation 1 satisfies from 2.2 to 2.4.

$$2.1 \leq (B1+B2)/(A) \leq 2.5 \quad \text{[Equation 1]}$$

((B1+B2)/(A)), or the weight ratio of the first and second photopolymerizable compounds (B1 and B2) relative to the copolymer (A), may be from 2.1 to 2.5, and preferably from 2.2 to 2.4. Within the range, good elasticity recovery rate may be obtained. However, if the weight ratio deviates from the range, particularly if the weight ratio is less than 2.1, the ratio of the photopolymerizable compound (B) is small, and thus the number of crosslinking bond formed after exposure may decrease, thereby deteriorating elasticity recovery rate. If the weight ratio is greater than 2.5, a development process may be deteriorated due to defects such as white turbidity or stain for insufficiency of the copolymer (A), i.e., an alkali-soluble resin.

In addition, the weight ratio of the first photopolymerizable compound (B1) containing hexa- or less functional groups and the second photopolymerizable compound (B2) containing hepta- or more functional groups satisfies the following Equation 2.

$$0.2 \leq B2/B1 \leq 0.5 \quad \text{[Equation 2]}$$

The weight ratio of the second photopolymerizable compound (B2) relative to the first photopolymerizable compound (B1) is from 0.2 to 0.5, and within this range, good elasticity recovery rate may be obtained. If the weight ratio deviates from this range, particularly if the weight ratio is less than 0.2, the photosensitivity of the composition may increase, and the resolution of a pattern may be deteriorated. If the weight ratio is greater than 0.5, the photosensitivity may be relatively deteriorated, and the crosslinking degree may vary, thereby deteriorating elasticity recovery rate.

(C) Photopolymerization Initiator

The photosensitive resin composition according to the present invention includes a photopolymerization initiator.

The photopolymerization initiator may initiate polymerization of curable monomers upon exposure to light such as visible rays, ultraviolet rays, and deep-ultraviolet radiation. The photopolymerization initiator may be a radical initiator, which is not specifically limited but may be at least one selected from the group consisting of an acetophenone compound, a benzophenone compound, a benzoin compound, a benzoyl compound, a xanthone compound, an oxime compound, a triazine compound, a halomethyloxadiazole compound, and a lophine dimer compound. Preferably, the oxime photopolymerization initiator, the triazine photopolymerization initiator, or a combination thereof may be used.

Examples of the photopolymerization initiator may include, but are not limited to, 2,2'-azobis (2,4-dimethylvaleronitrile), 2,2'-azobis(4-methoxy-2,4-dimethylvaleronitrile), benzoyl peroxide, lauryl peroxide, t-butyl peroxypivalate, 1,1-bis(t-butyl peroxy)cyclohexane, p-dimethylamino acetophenone, 2-benzyl-2-(dimethylamino)-1-[4-(4-morpholinyl)phenyl]-1-butanone, 2-hydroxy-2-methyl-1-phenyl-propan-1-one, benzyl dimethyl ketal, benzophenone, benzoin propyl ether, diethyl thioxanthone, 2,4-bis(trichloromethyl)-6-p-methoxyphenyl-s-triazine, 2-trichloromethyl-5-styryl-1,3,4-oxodiazole, 9-phenylacridine, 3-methyl-5-amino-((s-triazin-2-yl)amino)-3-phenylcoumarin, 2-(o-chlorophenyl)-4,5-diphenylimidazolyl dimer, 1-phenyl-1,2-propanedione-2-(o-ethoxycarbonyl)oxime, 1-[4-(phenylthio)phenyl]-octane-1,2-dione-2-(o-benzoyloxime), o-benzoyl-4'-(benzmercapto)benzoyl-hexyl-ketoxime, 2,4,6-trimethylphenylcarbonyl-diphenylphosphonyloxide, hexafluorophosphoro-trialkylphenyl sulfonium salt, 2-mercaptobenzimidazole, 2,2'-benzothiazolyl disulfide, 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2-[4'-ethyl(1, 1'-biphenyl)-4-yl]-4,6-bis(trichloromethyl)-1,3,5-triazine, 2-[4-(2-phenylethyl)phenyl]-4,6-bis(trichloromethyl)-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methyl-phenyl)ethenyl]-1,3,5-triazine, 2,4-bis(trichloromethyl)-6-[2-(3,4-dimethoxyphenyl)ethenyl]-1,3,5-triazine, and a mixture thereof.

More particularly, the oxime photopolymerization initiator may be an oxime ester compound.

Preferred for high sensitivity are one or more oxime compounds disclosed in Korean Laid-open Patent Publization Nos. 2004-0007700, 2005-0084149, 2008-0083650, 2008-0080208, 2007-0044062, 2007-0091110, 2007-0044753, 2009-0009991, 2009-0093933, 2010-0097658, 2011-0059525, 2011-0091742, 2011-0026467, and 2011-0015683, and International Publization Nos. WO 2010/102502 and WO 2010/133077. Particular examples of commercially available photopolymerization initiators include OXE-01 (BASF Co.), OXE-02 (BASF Co.), N-1919 (ADEKA Co.), NCI-930 (ADEKA Co.), NCI-831 (ADEKA Co.), and the like.

The photopolymerization initiator may be included in an amount of 0.01 to 10 parts by weight based on 100 parts by weight of the copolymer (based on the solid content). For example, the oxime photopolymerization initiator may be included in an amount of 0.01 to 5 parts by weight, and preferably 0.1 to 1 part by weight based on 100 parts by weight of the copolymer (based on the solid content), and the triazine photopolymerization initiator may be included in an amount of 0.01 to 5 parts by weight, and preferably 0.1 to 3 parts by weight based on 100 parts by weight of the copolymer (based on the solid content). Within this range, highly sensitive patterns having good pattern developability and coatability may be obtained.

(D) Solvent

The photosensitive resin composition of the present invention may preferably be prepared as a liquid composition by mixing the above components with a solvent.

Any solvent known in the art, which is compatible but not reactive with the components in the photosensitive resin composition may be used.

Examples of the solvent may include an organic solvent and may particularly include alcohol, ether, glycol ether, ethylene glycol alkyl ether acetate, diethylene glycol, propylene glycol monoalkyl ether, propylene glycol alkyl ether acetate, propylene glycol alkyl ether propionate, aromatic hydrocarbon, ketone, ester, and a mixture thereof.

Particular examples of the solvent include methanol, ethanol, tetrahydrofuran, dioxane, methyl cellosolve acetate, ethyl cellosolve acetate, ethyl acetoacetate, ethylene glycol monomethyl ether, ethylene glycol monoethyl ether, ethylene glycol dimethyl ether, ethylene glycol diethyl ether, propylene glycol dimethyl ether, propylene glycol diethyl ether, diethylene glycol monomethyl ether, diethylene glycol monoethyl ether, diethylene glycol dimethyl ether, diethylene glycol ethyl methyl ether, propylene glycol monomethyl ether, propylene glycol monoethyl ether, propylene glycol monopropyl ether, dipropylene glycol dimethyl ether, dipropylene glycol diethyl ether, propylene glycol methyl ether acetate, propylene glycol ethyl ether acetate, propylene glycol propyl ether acetate, dipropylene glycol methyl ether acetate, propylene glycol butyl ether acetate, 3-methoxy butyl acetate, toluene, xylene, methyl ethyl ketone, 4-hydroxy-4-methyl-2-pentanone, cyclopentanone, cyclohexanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 2-methoxypropionate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methylpyrrolidone, and the like.

Preferred among these exemplary solvents are ethylene glycol alkyl ether acetate, diethylene glycol, propylene glycol mono alkyl ether, propylene glycol alkyl ether acetate, and ketone. Particularly, diethylene glycol dimethyl ether, diethylene glycol ethyl methyl ether, dipropylene glycol dimethyl ether, dipropylene glycol diethyl ether, propylene glycol monomethyl ether, propylene glycol monoethyl ether, propylene glycol methyl ether acetate, 3-methoxy butyl acetate, methyl 2-methoxypropionate, γ-butyrolactone, and 4-hydroxy-4-methyl-2-pentanone are preferred.

The above solvents may be used alone or in combination of two or more thereof.

The photosensitive resin composition of the present invention may include the solvent, particularly the organic solvent in an amount of 5 to 50 wt %, preferably 10 to 30 wt %, and more preferably 15 to 25 wt % on the basis of the total amount of the composition on the basis of the solid content. The solid content means the amount of the components in the resin composition of the present invention excluding solvents.

(E) Epoxy Compound

The photosensitive resin composition of the present invention includes an epoxy compound as an auxiliary curing agent to increase the internal density, the mechanical strength, and the adhesiveness to a substrate of a thin film formed through a thermal curing process. The epoxy compound may be a homo oligomer or a hetero oligomer of an unsaturated monomer including at least one epoxy group.

Examples of the unsaturated monomer including at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, and a mixture thereof. Preferably, 4-hydroxybutyl acrylate glycidyl ether may be used in consideration of storage stability at room temperature and solubility.

The epoxy compound may be derived from a monomer represented by the following Formula 1.

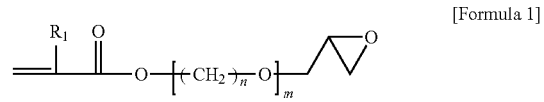

In Formula 1, $R_1$ is hydrogen or $C_{1-4}$ alkyl; n is an integer of 2 to 4; and m is an integer of 0 to 2.

The epoxy compound (E) may further include a structural unit derived from a monomer other than the compound of Formula 1.

Representative examples of the structural unit derived from the monomer other than the compound of Formula 1 may include styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; p-hydroxy-α-methylstyrene, acetylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly (ethylene glycol) methyl ether (meth)acrylate, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether, and vinyl ethyl ether; an unsaturated ether having an epoxy group such as allyl glycidyl ether, and 2-methyl allyl glycidyl ether; an unsaturated imide such as N-phenylmaleimide, N-(4-chlorophenyl)maleimide, N-(4-hydroxyphenyl) maleimide, and N-cyclohexylmaleimide. The structural unit derived from the above exemplary compounds may be contained in the epoxy compound (E) alone or in combination of two or more thereof.

The epoxy compound is a thermally crosslinked compound and has a lower molecular weight than the copolymer (A). The weight average molecular weight of the epoxy compound is in a range of 100 to 30,000, preferably 5,000 to 10,000. Within the range, improved adhesiveness to a substrate may be achieved, and a thermally cured film may have good hardness due to the formation of crosslinking bonds and have optimal viscosity range, thereby achieving appropriate flowability, good surface planarity and uniform thin film thickness.

The epoxy compound may be included in an amount of 1 to 10 parts by weight, preferably 3 to 7 parts by weight based on 100 parts by weight of the copolymer (on the basis of the solid content). Within the amount range, elasticity recovery rate and adhesiveness to a substrate may be improved. If the amount deviates from the range, particularly, if the amount is less than 1 part by weight, the elasticity recovery rate and the adhesiveness to a substrate may be deteriorated, and if the amount is greater than 10 parts by weight, developability may be deteriorated and stain and white turbidity may be generated during a development step.

(F) Surfactant

The photosensitive resin composition of the present invention may further include a surfactant as occasion demands to enhance its coatability and to prevent the formation of defects.

The surfactants are not limited, but preferred are fluorine-based surfactants, silicon-based surfactants, non-ionic surfactants, and the like. Preferably, BYK 307 of BYK Co. may be used in consideration of dispersibility.

Examples of the surfactants may include fluorine- and silicon-based surfactants such as BM-1000, and BM-1100 manufactured by BM CHEMIE Co., Ltd., Megapack F142 D, F172, F173, F183, F-470, F-471, F-475, F-482, and F-489 manufactured by Dai Nippon Ink Kagaku Kogyo Co., Florad FC-135, FC-170 C, FC-430, and FC-431 manufactured by Sumitomo 3M Co., Sufron S-112, S-113, S-131, S-141, S-145, S-382, SC-101, SC-102, SC-103, SC-104, SC-105, and SC-106 manufactured by Asahi Glass Co., Eftop EF301, EF303, and EF352 manufactured by Shinakida Kasei Co., SH-28 PA, SH-190, SH-193, SZ-6032, SF-8428, DC-57, and DC-190 manufactured by Toray Silicon Co., DC3PA, DC7PA, SH11PA, SH21PA, SH8400, FZ-2100, FZ-2110, FZ-2122, FZ-2222, and FZ-2233 manufactured by Dow Corning Toray Silicon Co., TSF-4440, TSF-4300, TSF-4445, TSF-4446, TSF-4460, and TSF-4452 manufactured by GE Toshiba Silicon Co., and BYK-333 manufactured by BYK Co.; non-ionic surfactants such as polyoxyethylene alkyl ethers including polyoxyethylene lauryl ether, polyoxyethylene stearyl ether, polyoxyethylene oleyl ether, and the like, polyoxyethylene aryl ethers including polyoxyethylene octylphenyl ether, polyoxyethylene nonylphenyl ether, and the like, and polyoxyethylene dialkyl esters including polyoxyethylene dilaurate, polyoxyethylene distearate, and the like; and organosiloxane polymer KP341 (manufactured by Shin-Etsu Kagaku Co.), (meth)acrylate-based copolymer Polyflow No. 57 and 95 (Kyoei Yuji Kagaku Co.), and the like. These surfactants may be used alone or in combination of two or more thereof.

The surfactant may be contained in an amount of 0.01 to 3 parts by weight, preferably 0.1 to 1 part by weight, based on 100 parts by weight of the copolymer (on the basis of the solid content). Within the amount range, the composition can be readily coated.

(G) Silane Coupling Agent

The photosensitive resin composition of the present invention may further include a silane coupling agent having a reactive substituent selected from the group consisting of carboxyl, (meth)acryloyl, isocyanate, amino, mercapto, vinyl, epoxy, and a combination thereof to improve adhesiveness to a substrate, if desired.

The kind of the silane coupling agent is not limited, but may preferably be selected from the group consisting of trimethoxysilyl benzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, γ-glycidoxypropyltriethoxysilane, β-(3,4-epoxycyclohexyDethyltrimethoxysilane, N-phenyl-3-aminopropyltrimethoxysilane, 3-aminopropylethyldimethoxysilane, 3-aminopropylmethyldiacetoxysilane, 3-aminopropylethyldi-n-propyloxysilane, and a mixture thereof. Preferred among them is γ-isocyanatopropyltriethoxysilane having an isocyanate group (KBE-9007 manufactured by Shin-Etsu Co.), which has good chemical resistance and good adhesiveness to a substrate, and N-phenyl-3-aminopropyl trimethoxysilane (Sila-AceXS1075 manufactured by JNC Co.), which has an amino group which may be readily combined with a functional group in a binder.

The amount of the silane coupling agent may be 0.01 to 10 parts by weight based on 100 parts by weight of the copolymer (on the basis of the solid content). For example, the silane coupling agent having the isocyanate group may be used in an amount of 0.01 to 1 part by weight, preferably 0.1 to 0.5 parts by weight, and the silane coupling agent having the amino group may be used in an amount of 0.01 to 5 parts by weight, preferably 0.1 to 1 part by weight. Within the range, the photosensitive resin composition may have improved adhesiveness.

Besides the above components, the photosensitive resin composition of the present invention may further include other additives such as an antioxidant, and a stabilizer as long as the properties of the composition are not adversely affected.

By using the photosensitive resin composition according to the present invention, a cured film, particularly a spacer may be prepared.

The cured film may be prepared by a conventional method well known in the art. For instance, the photosensitive resin composition may be coated on a silicon substrate by a spin coating method; subjected to pre-bake at a temperature of, e.g., 60 to 130° C. for 60 to 130 seconds to remove the solvents; exposed to light using a photomask having a desired pattern; and subjected to development using a developing agent, for example, a tetramethylammonium hydroxide (TMAH) solution, to form a pattern on the coated film. The light exposure may be carried out at a wavelength ranging from 200 to 450 nm at the exposure intensity of 10 to 100 mJ/cm$^2$. Then, the coated film thus patterned may be subjected to post-bake at a temperature of 150 to 300° C. for 10 minutes to 5 hours to manufacture a desired cured film.

According to a load-unload test using an elasticity measuring device, the cured film prepared from the photosensitive resin composition of the present invention may have (1) a pattern critical dimension(CD, line width) ratio of top/bottom parts of 50 to 70%, and (2) elasticity recovery rate of 70% or more.

The top part of the pattern refers to a part corresponding to 90% of the thickness of a final pattern, and the bottom part of the pattern refers to a part corresponding to 10% of the thickness of the final pattern. Elasticity recovery rate may be measured by the method of Test Example 1 below.

MODE FOR THE INVENTION

Hereinafter, the present invention is explained in detail with reference to the following examples. The examples are intended to further illustrate the present invention without limiting its scope.

In the following examples, the weight average molecular weight is determined by gel permeation chromatography (GPC) using a polystyrene standard.

Preparation Example 1: Preparation of Copolymer (A)

To a 500 mL, round-bottomed flask equipped with a reflux condenser and a stirrer, 100 g of a monomer mixture containing 51 mole % of N-phenylmaleimide, 5 mole % of styrene, 12.5 mole % of 4-hydroxybutyl acrylate glycidyl ether (4-HBAGE, trade name: GHP-07P manufactured by Miwon Co.), and 31.5 mole % of methacrylic acid, 300 g of a PGMEA solvent, and 2 g of 2,2'-azobis(2,4-dimethylvaleronitrile) as a radical polymerization initiator were added, and the temperature was elevated to 70° C., followed by stirring for 5 hours to obtain a copolymer having a solid content of 31%. The copolymer thus produced has an acid value of 28 mgKOH/g, and the weight average molecular weight of the copolymer was 16,000 when determined by gel permeation chromatography referenced to polystyrene.

Example 1

100 parts by weight of the copolymer (A) (the solid content) obtained in Preparation Example 1, 154 parts by weight of dipentaerythritol hexaacrylate as a photopolymerizable compound (B1, trade name: DPHA manufactured by Nippon Kayaku Co.), 69 parts by weight of tripentaerythritol heptaacrylate (B2, trade name: V802 manufactured by OCC Co.), 1 part by weight of an oxime photopolymerization initiator (C1, trade name: OXE-02 manufactured by BASF Co.) as a photopolymerization initiator, 2.3 parts by weight of a triazine photopolymerization initiator (C2, trade name: T-EB manufactured by Pharmasynthese Co.), 5.1 parts by weight of 4-HBAGE (E, trade name: GHP-07P manufactured by Miwon Co.) as an epoxy additive, 0.7 part by weight of a surfactant (F, trade name: BYK-307 manufactured by BYK Co.), 0.2 part by weight of a silane coupling agent having an isocyanate group (G1, trade name: Sila-AceXS1075 manufactured by JNC Co.), and 0.5 part by weight of an amino silane coupling agent (G2, trade name: KBE-9007, Shin-Etsu Chemical Co.) were mixed, and a mixture solvent of PGMEA (Chemtronics Co.) and 3-methoxybutyl acetate (3-MBA manufactured by Hannong Chemicals Co.) in a weight ratio of 85:15 with the solid content of 19% was added thereto, followed by mixing for 2 hours using a shaker to prepare a liquid-phase photosensitive resin composition.

Examples 2 to 4

Photosensitive resin compositions were prepared by performing the same procedure described in Example 1 with the exception that the amounts of the components used were changed as illustrated in the following Table 1.

Comparative Examples 1 to 4

Photosensitive resin compositions were prepared by performing the same procedure described in Example 1 with the exception that the amounts of the components used were changed to a range not satisfying the above Equations 1 to 3, as indicated in Table 1 below.

TABLE 1

| | Copolymer (A) Preparation | Photopolymerizable compound (B) | | | Photopolymerization initiator (C) | | Solvent (D) | | Epoxy compound (E) | Surfactant (F) | Silane coupling agent (G) | | Equation 1 | Equation 2 |
|---|---|---|---|---|---|---|---|---|---|---|---|---|---|---|
| | Ex. 1 | B1 | B2 | B1 + B2 | C1 | C2 | PGMEA | 3-MBA | 4-HBAGE | BYK | G1 | G2 | (B1 + B2)/(A) | B2/B1 |
| Ex. 1 | 100 | 154 | 69 | 223 | 1 | 2.3 | 85 | 15 | 5.1 | 0.7 | 0.2 | 0.5 | 2.23 | 0.45 |
| Ex. 2 | 100 | 150 | 73 | 223 | 1 | 2.3 | 85 | 15 | 5.1 | 0.7 | 0.2 | 0.5 | 2.23 | 0.49 |
| Ex. 3 | 100 | 150 | 78 | 228 | 1 | 2.4 | 85 | 15 | 5.1 | 0.7 | 0.2 | 0.5 | 2.28 | 0.52 |
| Ex. 4 | 100 | 183 | 50 | 233 | 1 | 2.4 | 85 | 15 | 5.1 | 0.7 | 0.2 | 0.5 | 2.33 | 0.28 |
| Com. Ex. 1 | 100 | 210 | 23 | 233 | 1 | 2.4 | 85 | 15 | 5.1 | 0.7 | 0.2 | 0.5 | 2.33 | 0.11 |
| Com. Ex. 2 | 100 | 150 | 83 | 233 | 1 | 2.4 | 85 | 15 | 5.1 | 0.7 | 0.2 | 0.5 | 2.33 | 0.56 |
| Com. Ex. 3 | 100 | 136 | 67 | 203 | 0.9 | 2.2 | 85 | 15 | 4.7 | 0.7 | 0.2 | 0.5 | 2.03 | 0.49 |
| Com. Ex. 4 | 100 | 202 | 98 | 300 | 1.2 | 2.9 | 85 | 15 | 6.2 | 0.7 | 0.2 | 0.6 | 3.00 | 0.49 |

B1: Dipentaerythritol hexaacrylate
B2: Tripentaerythritol heptaacrylate
C1: Oxime photopolymerization initiator (trade name: OXE-02 manufactured by BASF Co.)
C2: Triazine photopolymerization initiator (trade name: T-EB manufactured by Pharmasynthese)
G1: Silane coupling agent having an isocyanate group (trade name: Sila-AceXS1075 manufactured by JNC Co.)
G2: Silane coupling agent having an amino group (trade name: KBE-9007 manufactured by Shin-Etsu Chemical Co.)

[Manufacture of Cured Film]

Each of the photosensitive resin compositions obtained in the examples and comparative examples was coated on a glass substrate using a spin coater and pre-baked at a temperature of 80° C. for 150 seconds to form a coated film in a thickness of 3.7 μm. On the cured film, a patterned mask wherein dot patterns having a size of 6 to 20 μm were disposed at intervals of 1 μm, was applied so that the distance from the substrate was 50 μm. Then, the film was exposed to light emitted from an aligner (model: MA6) at a wavelength ranging from 200 nm to 450 nm at the exposure intensity of 66 mJ/cm² based on a wavelength of 365 nm. The film was developed by an aqueous solution of 0.04 wt % potassium hydroxide as a developing agent, at 23° C. for 70 seconds. Subsequently, the film thus developed was post-baked in an oven at 230° C. for 30 minutes to produce a cured film. The bottom critical dimension(CD) of the dots formed on the substrate thus formed was 10 to 12 μm based on the mask's CD 10 μm.

Experimental Example 1: Measure of Elasticity Recovery Rate

According to the above-described method for preparing a cured film, a cured film having a total thickness of 3.0 (±0.1) μm after post-baking and a diameter of a spacer dot pattern of 10 to 12 μm was formed. Compression displacement and elasticity recovery rate were measured using an elasticity measuring device (Fischerscope® HM2000LT manufactured by Fischer Technology Co.) according to the following measurement conditions. A planar Vicker's penetrator having a size of 50 μm×50 μm and a square pendulum shape was used as a penetrator compressing patterns. Measurement was conducted by a load-unload method. A load of 1.96 mN was applied to a dot pattern using the elasticity measuring device, and this state was set as an initial condition (H0) for measuring physical properties, i.e., the compression displacement and the elasticity recovery rate. Then, a load up to 40 mN was applied with a rate of 2.5 mN/sec for each of pattern specimens and the load was kept for 5 seconds, and a distance (H1) moved by the penetrator at this point was measured. The load was kept for 5 seconds, was removed again with a rate of 2.5 mN/sec in a thickness direction, and was kept for 5 seconds when a force applied to the dot pattern by the penetrator reached 1.96 mN. A distance (H2) moved by the penetrator at this point was measured, and elasticity recovery rate was computed by Equation 3. The results are indicated in Table 2 below and FIG. 1.

Elasticity recovery rate (%)=[(H1−H2)/(H1−H0)×100]     [Equation 3]

Experimental Example 2: Evaluation of Resolution

A pre-cured film having a thickness of 3.0 (±0.1) μm was formed according to the above-described preparation method of a cured film, and was exposed and developed with a photo mask having a pattern size of 8, 10, 12 and 14 μm under the same conditions for the development of the above cured film. The bottom CD (μm) of the pattern of the cured film thus formed was measured, the resolution was evaluated, and the results are shown in Table 2 below. The resolution was evaluated as ○ if critical dimension of the pattern measured was 13 μm or less, and the resolution was evaluated as x if CD of the pattern measured was greater than 13 μm based on the mask's 10 μm.

Experimental Example 3: Measure of Top/Bottom Pattern Width Ratio

A spacer having a thickness (T) of 3.0 (±0.1) μm and a diameter of a dot pattern (bottom) of 10 to 12 μm was formed from a photosensitive resin composition, and top CD (a part corresponding to 90% of the thickness of a final pattern) and bottom CD (a part corresponding 10% of the thickness of a final pattern) were measured using a height difference measuring device (SIS-2000 manufactured by SNU Precision). The top/bottom CD ratio of a spacer pattern was determined using the following Equation 4, and the results are shown in Table 2 below. In the case where the CD ratio is 50 to 70%, the elasticity recovery rate of the spacer may be assessed as good.

Top/bottom pattern CD ratio (%)=(Top width/bottom CD)×100     [Equation 4]

TABLE 2

|  | Ex. 1 | Ex. 2 | Ex. 3 | Ex. 4 | Com. Ex. 1 | Com. Ex. 2 | Com. Ex. 3 | Com. Ex. 4 |
|---|---|---|---|---|---|---|---|---|
| H1 (μm) | 0.752 | 0.746 | 0.715 | 0.718 | 0.712 | 0.772 | 0.789 | — |
| H2 (μm) | 0.277 | 0.278 | 0.255 | 0.27 | 0.277 | 0.313 | 0.334 | — |
| H0 (μm) | 0.08 | 0.08 | 0.072 | 0.082 | 0.094 | 0.101 | 0.092 | — |
| Elasticity recovery rate (%) | 70.7 | 70.2 | 71.5 | 70.4 | 70.0 | 68.4 | 65.3 | Undeveloped |
| Resolution (dot CD size) | ○ | ○ | ○ | ○ | X | ○ | ○ | Undeveloped |
| Top pattern width (μm) | 6.94 | 6.28 | 6.89 | 6.89 | 6.93 | 6.33 | 5.68 | — |
| Bottom pattern width (μm) | 11.96 | 11.87 | 12.01 | 12.34 | 13.27 | 12.36 | 12.47 | — |
| Top/bottom ratio (%) | 58 | 53 | 57 | 56 | 52 | 51 | 46 | — |

Referring to Table. 2, all the cured films that are prepared from the compositions of Examples 1 to 4 and satisfy Equations 1 and 2 had elasticity recovery rate of 70% or more, and dot CD was measured as 13 μm or less. In addition, the top/bottom CD ratio of the spacer was 50 to 70%, and the elasticity recovery rate was assessed as good.

In contrast, the cured films prepared from the compositions of Comparative Examples 1 to 3 had elasticity recovery rate of less than 70% (Comparative Examples 2 and 3), had dot CD size greater than 13 μm (Comparative Example 1), or had top/bottom pattern CD ratio of less than 50% (Comparative Example 3). In addition, the cured film prepared from the composition of Comparative Example 4 was not successfully developed.

Accordingly, the cured film obtained from the composition of the present invention maintains high resolution and exhibits good elasticity recovery rate, and may be effectively used for the formation of a spacer of a liquid crystal display and an organic EL device.

The invention claimed is:
1. A photosensitive resin composition, comprising:
(A) a copolymer;
(B) a photopolymerizable compound comprising a first photopolymerizable compound (B1) containing hexa- or less functional groups and a second photopolymerizable compound (B2) containing hepta- or more functional groups; and

(C) a photopolymerization initiator, wherein a weight ratio of the copolymer (A) and the first and second photopolymerizable compounds (B1 and B2) satisfies the following Equation 1, and a weight ratio of the first photopolymerizable compound (B1) and the second photopolymerizable compound (B2) satisfies the following Equation 2:

$$2.1 \leq (B1+B2)/(A) \leq 2.5 \quad \text{[Equation 1]}$$

$$0.2 \leq B2/B1 \leq 0.5 \quad \text{[Equation 2]}$$

wherein the first photopolymerizable compound (B1) is at least one selected from the group consisting of ethylene glycol di(meth)acrylate, propylene glycol di(meth)acrylate, diethylene glycol di(meth)acrylate, triethylene glycol di(meth)acrylate, glycerin tri(meth)acrylate, trimethylolpropane tri(meth)acrylate, dipentaerythritol tetra(meth)acrylate, dipentaerythritol penta(meth)acrylate and dipentaerythritol hexa(meth)acrylate.

2. The photosensitive resin composition of claim 1, wherein the value of (B1+B2)/(A) is from 2.2 to 2.4 in Equation 1.

3. The photosensitive resin composition of claim 1, wherein the copolymer (A) comprises (A1) a structural unit derived from an ethylenically unsaturated carboxylic acid, an ethylenically unsaturated carboxylic anhydride, or a mixture thereof; and (A2) a structural unit derived from an ethylenically unsaturated compound containing an aromatic ring.

4. The photosensitive resin composition of claim 1, further comprising an epoxy compound.

5. A cured film prepared from using the photosensitive resin composition of claim 1.

6. The cured film of claim 5, wherein the cured film has (1) a top/bottom pattern critical dimension of 50 to 70%, and (2) an elasticity recovery rate of 70% or more in a load-unload test using an elasticity measuring device.

* * * * *